United States Patent [19]

Fujita et al.

[11] 4,091,389
[45] May 23, 1978

[54] SELF-BALANCING RECORDER

[75] Inventors: Hisaya Fujita; Nobuo Kaieda; Setsuo Sato, all of Musashino, Japan

[73] Assignee: Yokogawa Electric Works, Ltd., Tokyo, Japan

[21] Appl. No.: 767,517

[22] Filed: Feb. 10, 1977

[30] Foreign Application Priority Data

Mar. 31, 1976 Japan .................................. 51-35647

[51] Int. Cl.² .......................... G01D 9/00; G01D 15/00
[52] U.S. Cl. ........................................ 346/32; 346/145
[58] Field of Search .................................. 346/32, 145

[56] References Cited

U.S. PATENT DOCUMENTS

| | | | |
|---|---|---|---|
| 2,113,748 | 4/1938 | Ross et al. | 346/145 |
| 2,150,502 | 3/1939 | Harrison et al. | 346/32 |
| 2,519,537 | 8/1950 | Barnes, Jr. | 346/145 X |
| 2,942,927 | 6/1960 | Keyser | 346/145 X |
| 3,148,014 | 9/1964 | King, Jr. et al. | 346/32 |
| 3,209,363 | 9/1965 | Virbila | 346/145 X |
| 3,370,300 | 2/1968 | Gilovich et al. | 346/32 X |
| 3,394,384 | 7/1968 | Hines | 346/32 |
| 3,798,659 | 3/1974 | Hasebe et al. | 346/145 X |
| 3,918,066 | 11/1975 | Fujita et al. | 346/32 X |

FOREIGN PATENT DOCUMENTS 908,884  10/1962  United Kingdom .................. 346/32

*Primary Examiner*—George H. Miller, Jr.
*Attorney, Agent, or Firm*—Parmelee, Johnson, Bollinger & Bramblett

[57] ABSTRACT

A simplified, compact, inexpensive portable self-balancing recorder to be used in the monitoring of data relating to pollution and/or environmental protection. The recorder is about 650 cubic centimeters in volume and weighs about 5 kilograms; it comprises a minimal number of constituent components and may be operated without certain costly options (e.g. alarms and controls) if desired. The recorder uses printed circuit board circuitry to monitor and process input signals from the measuring points, and these components can conveniently and easily be removed from the recorder for adjustments or replacements. The recorder includes means for adjusting the ink pressure according to recording conditions and provides an inking system with an hermetically sealed pen point to prevent introduction of bubbles into the ink.

11 Claims, 33 Drawing Figures

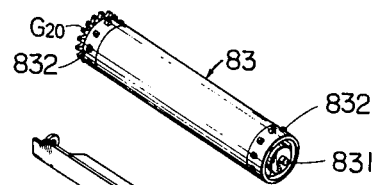
FIG. 24
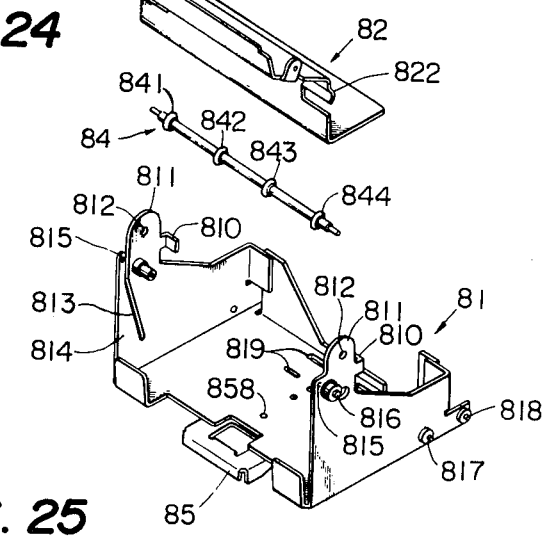
FIG. 25
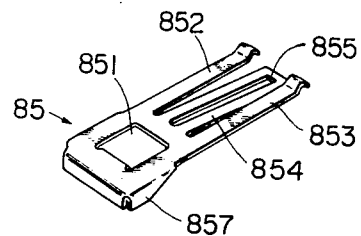

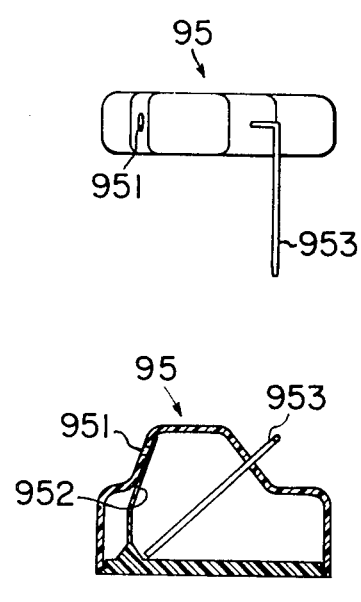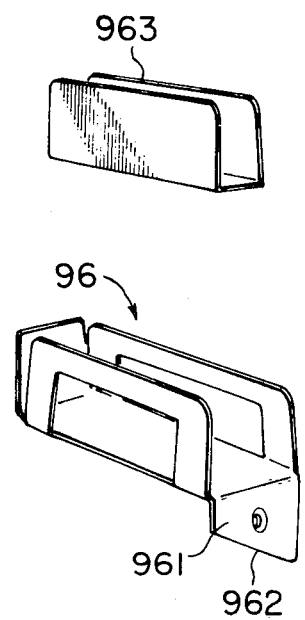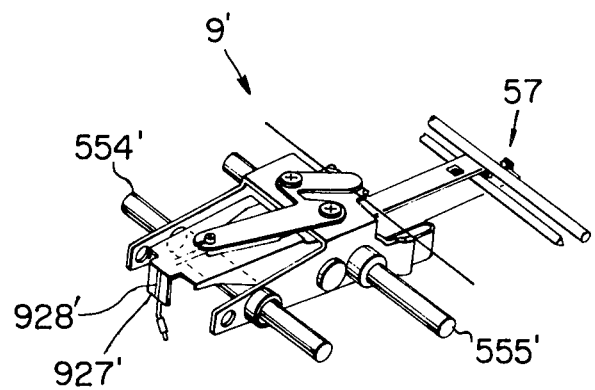

4,091,389

SELF-BALANCING RECORDER

BACKGROUND OF THE INVENTION

1. Field of the Invention

This invention relates to self-balancing recorders. More specifically, this invention relates to an inexpensive, portable, simplified and compact recorder which provides easy access to its components for adjustments or replacement.

2. Description of the Prior Art

In recent years there has been a growing concern about achieving a clean human environment, and particularly to protect the environment from industrial waste waters, exhausts, etc. This has necessitated monitoring of pollution data over long periods of time by the use of a recording instrument near the source of pollution. For such purpose prior art techniques have utilized self-balancing recorders of the type used in large-scale instrumentation systems. These recorders are normally equipped with a number of components which are unnecessary to the actual recording. Furthermore, they are too large and heavy to be carried about for installation wherever desired. Therefore, there has been a need in the art for simplified, compact, inexpensive portable self-balancing recorders.

SUMMARY OF THE INVENTION

It is therefore an object of the present invention to provide a self-balancing recorder comprising a minimal number of constituent components so as to provide for reducing the size and weight of the instrument. With this object in view, the invention provides a self-balancing recorder which measures only about 14 × 14 × 33 (cm), is about 650 cm³ in volume, and weighs only about 5 kg, permitting the recorder to be readily carried about. The recorder, though compact, employs a recording chart as wide as 10 cm for easy reading.

It is another object of the invention to provide a self-balancing recorder which can be serviced with ease. The recorder comprises a main printed circuit board, or mother board, installed at about the center of an instrument housing body. Around the mother board are sub-printed-circuit boards (or, briefly, sub-boards) including an amplifier card for amplifying input signals, and a range card for setting a measuring range. The sub-boards are dismountably set in position and electrical connections are made by means of connectors. A balancing motor and a chart feed synchronous motor are also dismountably set in position. Accordingly, these component parts can readily be dismounted for check, adjustment or replacement in the event of failure.

The purpose of recorders in general is to record measured data accurately. To this end, the recording mechanism must operate smoothly in response to a given input signal. In a recorder using ink, the supply of ink must be constant and smooth. With this consideration in view, the present invention provides a recorder comprising a novel inking system in which a pen point of dual construction is employed, making it possible to maintain the pen point hermetically sealed, thus preventing the introduction of bubbles into the ink from the pen point junction, and simplifying pen point replacement. Also, a spring system is employed for adjusting the pen pressure. Thus, in principle, the pen pressure can be maintained constant regardless of the weight of the body of the pen. Furthermore, the height of the ink tank is adjustable relative to the pen point so that the head can be adjusted. This permits the ink pressure to be adjusted according to recording conditions, thereby maintaining legible recording.

Further objects, features and advantages of the present invention will become more apparent from the following description when read in conjunction with the accompanying drawings.

BRIEF DESCRIPTION OF THE DRAWINGS

FIG. 24 is a perspective exploded view showing part of the chart feed mechanism shown in FIG. 23;

FIG. 25 is a perspective view of a pinch plate used for the chart feed mechanism;

FIG. 28 is a top view and a cross-sectional view showing the construction of an ink tank used for the inking system;

FIG. 29 is a perspective view showing a mounting member and a spacer for the ink tank;

FIG. 30 is a perspective view of a second pen used in the disclosed embodiment;

DESCRIPTION OF THE PREFERRED EMBODIMENTS

Figure 1:
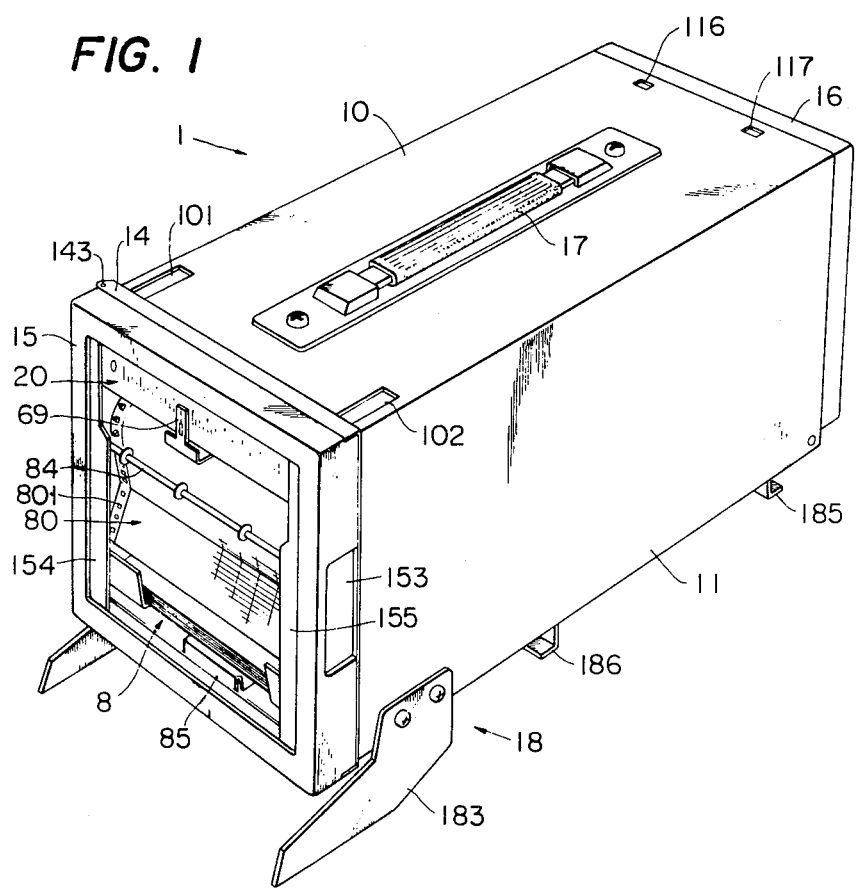
FIG. 1 is a perspective external view of a recorder embodying the invention.
Figure 2:
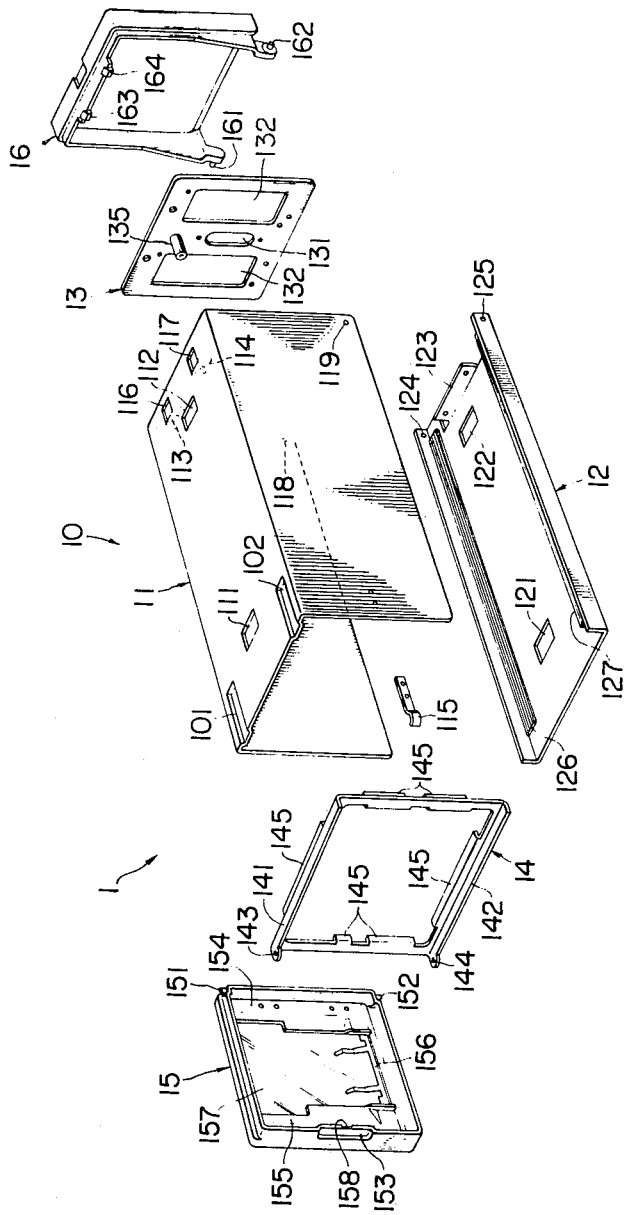
FIG. 2 is a perspective exploded view of an outer case used for the recorder shown in FIG. 1.

Referring now to FIG. 1, there is shown an external view of one recorder embodying the present invention, which comprises an elongated rectangular outer case 1. As shown in FIG. 2, the outer case 1 comprises a box-like body 10 and a door 15 installed at the front end of the case body 10. The case body 10 comprises a shell 11, a base plate 12, a rear plate 13, and a front frame 14. The shell 11 is formed from a thin iron plate of about uniform thickness. The door 15 is made of a synthetic resin and formed by molding.

Inwardly pressed portions 101 and 102 are formed on the shell 11 to allow a mating part to fit snugly into position. Mounting holes 111 and 112, and 121 and 122 are provided on the shell 11 and on the base plate 12 respectively. The shell 11 has bent portions 113 and 114. A spring plate 115 having one end bent like L, which is fastened to the shell 11 is provided. Sliding tapes 126 and 127 are fitted to the base plate 12 on opposite sides.

The rear plate 13 is formed with holes 131 and 132 for mounting a terminal plate. The front frame 14 has upper and lower flanges 141 and 142 to fit the door 15. Holes 143 and 144 are provided on the flanges 141 and 142 at the left ends respectively. A plurality of portions 145 bent at right angles opposite to the flanges 141 and 142 are formed internally on the front frame 14 so that these bent portions are fitted in the front end of the box-like case formed of the shell 11 and the base plate 12. The door 15 has shaft pins 151 and 152 on its upper and lower sides; the upper pin 151 is movable within a given range and provided with an upward force from a spring, thereby enabling the easy removal or attachment of the door 15 to the front frame 14.

The door 15 has a cut-out 153 on one side to fascilitate opening the door with the fingers. On the door 15 are side grilles 154 and 155, and a recording chart guide 156 made of steel wire which also serves to hold a measuring card describing the relationship between the recording ink color and the measuring point against a transparent pane 157. A rear cover 16 of synthetic resin is provided to cover terminal plates 133 and 134 and is installed on the rear plate 13 as shown in FIG. 3.

Figure 3:
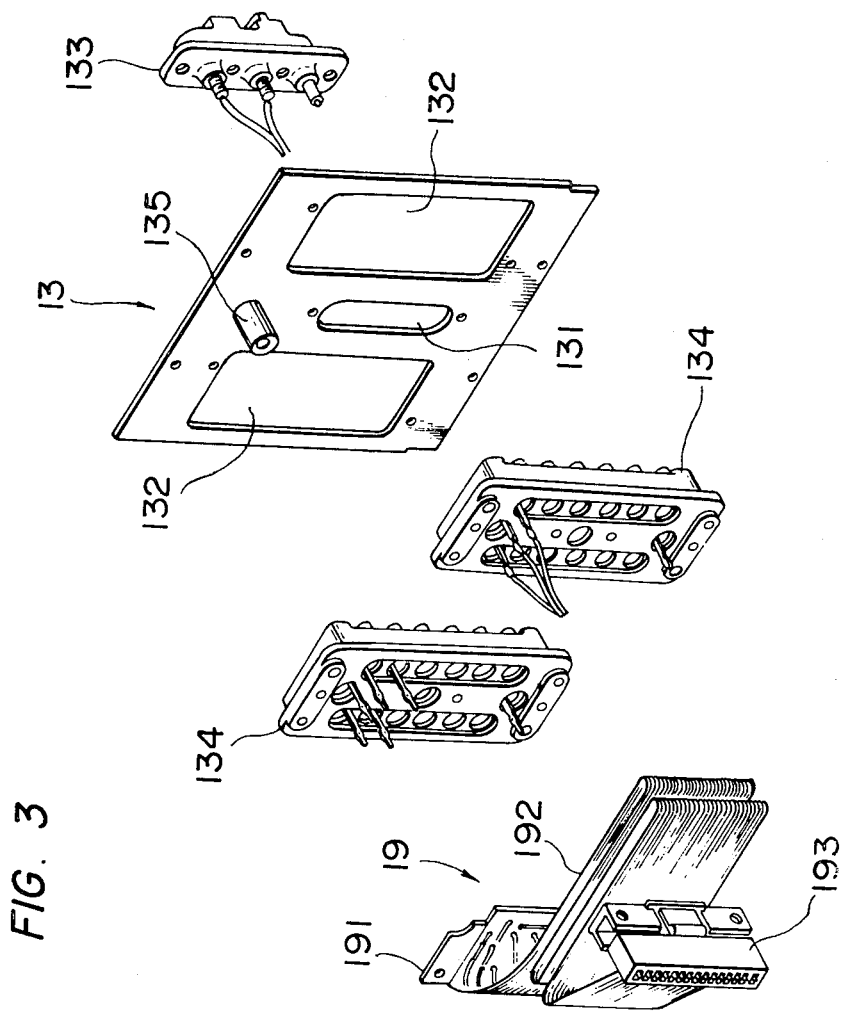
FIG. 3 is a perspective exploded view of components used adjacent to a rear plate in the outer case as in FIG. 1.

Referring to FIG. 3, an exploded view of the rear plate 13 is shown. The terminal plate 133 is provided for a commercial power supply and is mounted on the rear plate 13 through the hole 131. The left terminal plate 134 mounted on the rear plate 13 through the hole 132 has terminals for input signal lead wires from 6 measuring points. The right terminal plate 134 is used for alarm signals. A femal stud 135 is affixed to the rear plate 13.

A connecting member 19 comprises a printed circuit board 191 and a connector 193. This circuit board is connected to one side of the connector 193 by a flexible wire 192 comprising a conducting foil sandwiched between two films. The other side of the connector 193 is connected to a mother board, to be described later, thereby completing the electrical connections between the outer case 1 and the internal frame 2 to which the mother board is fastened. The zigzag configuration of the wire 192 provides slack and allows the internal frame 2 to be readily removed from the outer case 1 for check or adjustment without the necessity of disconnecting the wire 192. If necessary, the internal frame 2 can be completely dismounted from the outer case 1 after the connector 193 is disconnected from the wire 192.

The outer case 1 is built in the following manner. In FIG. 2, the shell 11, base plate 12 and front frame 14 are combined into a box-like construction, with bent-up portions fitted into position, and the mated portions are fastened together by spot-welding. The rear plate 13 is installed in the rear of the box with screws mated with tapped holes on the bent-up portions 113, 114 and 123 of the shell 11 and the base plate 12. The rear plate 13 may be detached therefrom by removing the screws.

The door 15 is mounted to the case body 10 in such manner that the lower shaft pin 152 is inserted into the hole 144 of the lower flange 142 and then the upper shaft pin 151 is inserted into the upper hole 143. The door 15 can be pivoted about the pins 151 and 152 through an angle of approximately 120°. When the door 15 is closed, the bent portion of the spring plate 115 engages a recess 158 to cause the door to be locked.

The rear cover 16 has bosses 161 and 162 on both sides, which engage the holes 124 and 125 of the base plate 12 and the holes 118 and 119 of the shell 11, the holes 124 and 125 being in alignment with the holes 118 and 119, enabling the rear cover 16 to be rotatably mounted on the case body 10. Thus the rear cover 16 can be fitted to the back of the case body 10 as it is rotated on the bosses 161 and 162 causing the pins 163 and 164 to engage the holes 116 and 117 of the shell 11. Instructions describing the electrical connections to the terminal plates 133 and 134 are affixed to the inner wall of the rear cover 16.

The case body 10 constructed in the foregoing manner is strong enough to protect the internal components and yet it is light in weight. Deformity of the outer case 1 caused by the dismounting of the internal frame 2 is prevented by reinforcing the front end of the case body 10 with the front frame 14. If necessary, the door 15 can be simply detached from the front frame 14 by means of the movable shaft pin 151.

Figure 4:
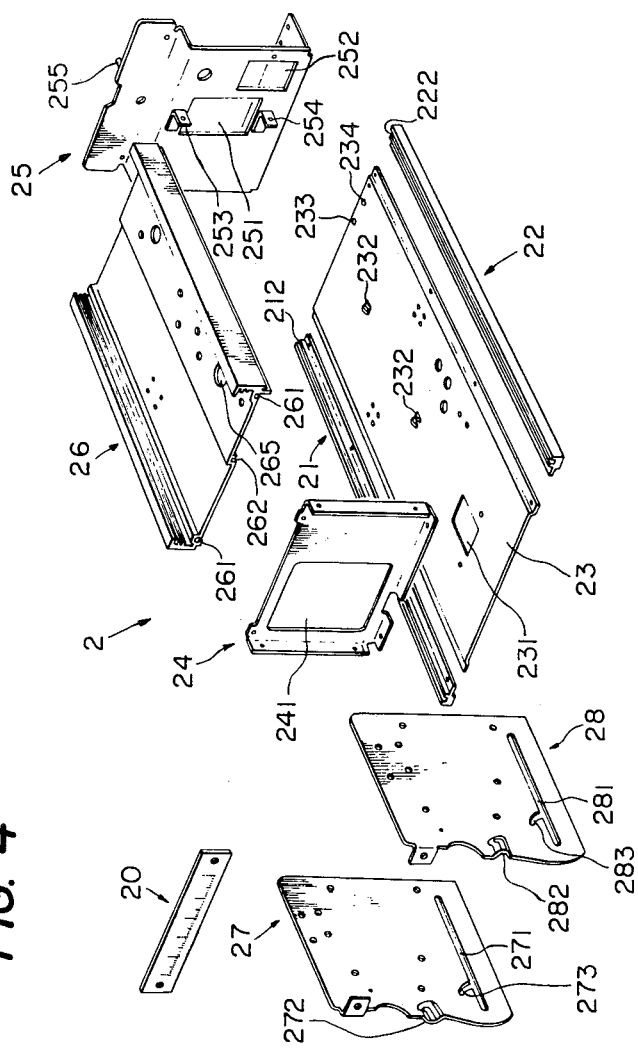
FIG. 4 is a perspective exploded view of internal frame components.

Referring to FIG. 4, a perspective exploded view of the internal frame 2 upon which instrument components are mounted is shown. The internal frame 2 comprises base rails 21 and 22, a base plate 23, an intermediate plate 24 and a rear plate 25 which are installed vertically on the base plate 23, a relatively thick upper plate 26, and symmetrical side plates 27 and 28 which are connected by screws. The base rails 21 and 22 and the upper plate 26 are made of aluminum, or cut from bars of extruded aluminum shaped for individual purposes. This eliminates machine tool work of forming grooves and holes on these components.

Figure 10:
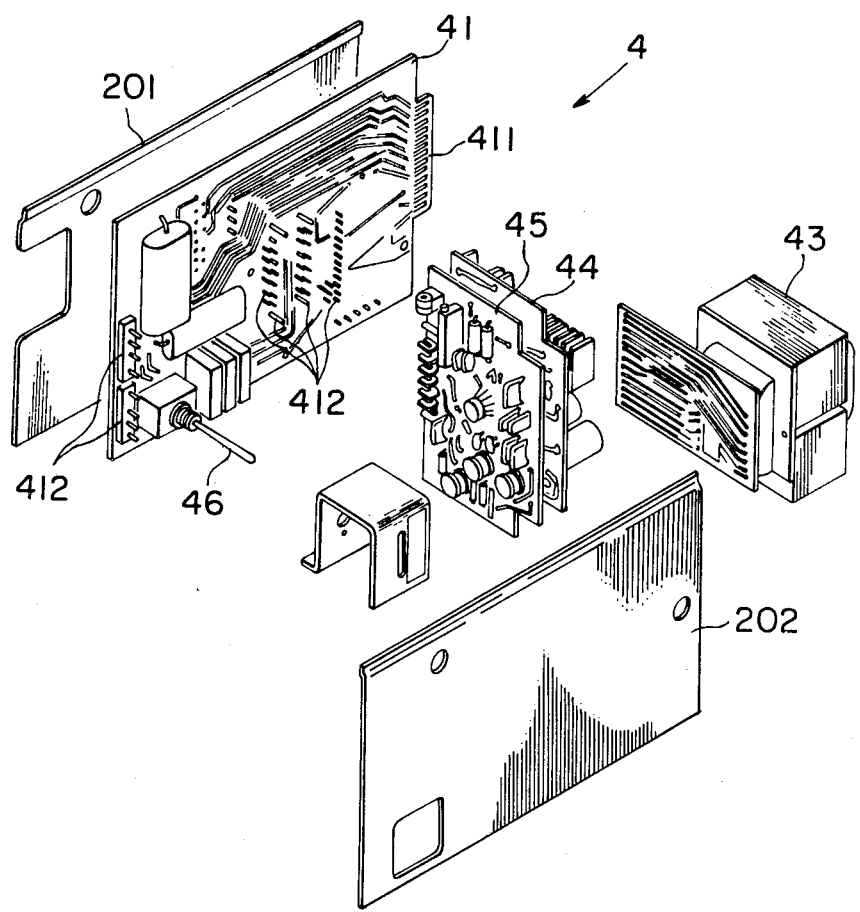
FIG. 10 is a perspective view showing the internal electrical circuits.

For example, one extruded aluminum bar has c-shaped grooves 261 for the upper plate 26, through which the rear plate 25 is connected to the plate 26 by screws. Also, square grooves 212, 222 and 262 formed by extrusion serve to guide the mother board and side cover plates 201 and 202 as shown in FIG. 10. On the back of the rear plate 25 is a pin for guiding the internal frame 2 into the outer case 1. Thus, the internal frame 2 on which internal components are mounted, is dismountably housed in the outer case 1.

Figure 5:
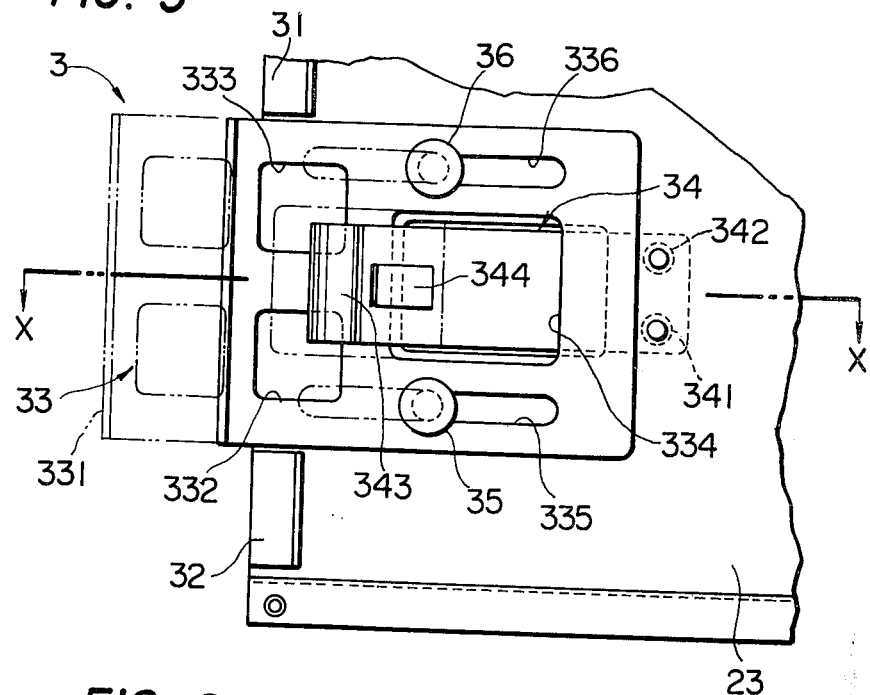
FIGS. 5 and 6 are schematic illustrations of parts used for fixing internal components to the outer case.
Figure 6:
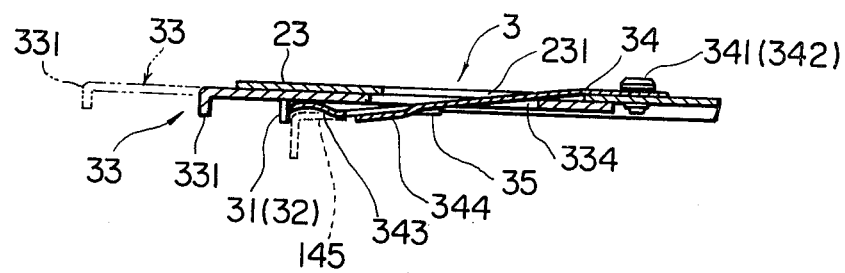
Figure 7:
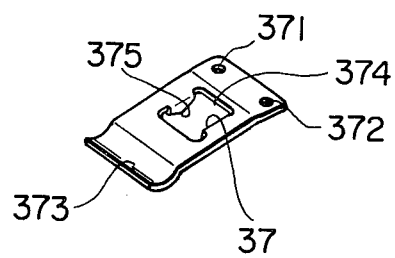
FIG. 7 is a perspective view of a fastening metal.

A stopper mechanism 3 installed on the base plate 23 prevents the internal frame 2 from sliding out of the outer case 1 when housed in that position. Constructional features of the stopper mechanism 3 are schematically illustrated in FIGS. 5 to 7. The stopper mechanism 3 comprises L-shaped spacers 31 and 32 fastened to the front of the base plate 23, a pulling lever 33 positioned between the spacers 31 and 32, a thin spring plate 34, and stopper pins 35 and 36.

An end 331 of the lever 33 is bent to facilitate pulling the lever 33 by the fingers when the internal frame 2 is withdrawn from the outer casing 1. The lever 33 has square openings 332 and 333 where the fingers are applied. Behind these openings are a square hole 334 and slots 335 and 336. The stopper pins 35 and 36 loosely engage the slots 335 and 336, permitting the lever 33 to slide across the length of the slots 335 and 336 when pulled. The square hole 334 on the lever 33 is in alignment with the square hole 231 on the base plate 23.

The spring stopper plate 34 has its rear part fastened to the base plate 23 by two screws 341 and 342, and its free end passing through the square holes 231 and 334 and extending underneath the pulling lever 33. The spring stopper plate 34 has a portion 343 of arcuate cross-section and a distended portion 344. The stopper mechanism shown in FIGS. 5 and 6 is in position to prevent the internal frame 2 from sliding out of the outer case 1.

When the pulling lever 33 is held back (at the right in FIG. 5), the pulling lever 33 becomes positioned between the base plate 23 and the stopper plate 34, thereby causing the free end of the stopper plate 34 to be lowered. As a result, an end of the distended portion 344 is prevented from moving any further than the bent portion 145 (indicated by the dotted line) of the front frame 14. This causes the internal frame 2 to be secured to the outer case 1.

When the pulling lever 33 is pulled out by pulling its bent end 331 with the fingers as indicated by the two-dot chain line in FIGS. 5 and 6, the arcuate portion 343 of the stopper plate 34 returns into the square hole 334 by spring force, causing the distended portion 344 to disengage from the bent portion 145 and thus enabling the internal frame 2 to be withdrawn from the outer case 1, with the exception of the rear of the internal frame 2 retained in the outer case 1 for the purpose of preventing the internal frame 2 from being dropped by inadvertence. A stopper 37 shown in FIG. 7 is used for this purpose.

The stopper 37 is similar to the stopper plate 34 in material and construction, having its rear end fastened to the bottom of the base plate 23 by screws 233 and 234 fastened through holes 371 and 372. The stopper 37 has a portion 373 of arcuate cross-section and an H-shaped hole 374 in the center. Triangular hooks 375 and 376 protrude downwards at right angles from the opposite edges of the hole 374.

These triangular hooks engage the bent portion 145 of the front frame 14 in a manner similar to the operation of stopper plate 34, causing the internal frame 2 to be partially retained in the outer case 1. The internal frame 2 can be completely withdrawn by raising the arcuate portion 373 of the stopper 37 thus disengaging the hooks 375 and 376 from the bent portion 145.

When the internal frame 2 is housed in or withdrawn from the outer case 1, the base rails 21 and 22 slide on the slide tapes 126 and 127 installed on both sides of the base plate 12, permitting smooth movement of the internal frame 2. The internal frame 2 is snugly housed in the outer case 1 and any loose play between the internal frame 2 and the outer case 1 is removed by the slide tapes 126 and 127, the pressed portions 101 and 102, and the bent portion 145 of the front frame 14. The internal frame 2, when housed in the outer case 1, is firmly set in position by the pin 255 on the rear side of the rear plate of the internal frame, which connects into the female stud 135 affixed to the front side of the rear plate of the outer case 1.

Figure 8:
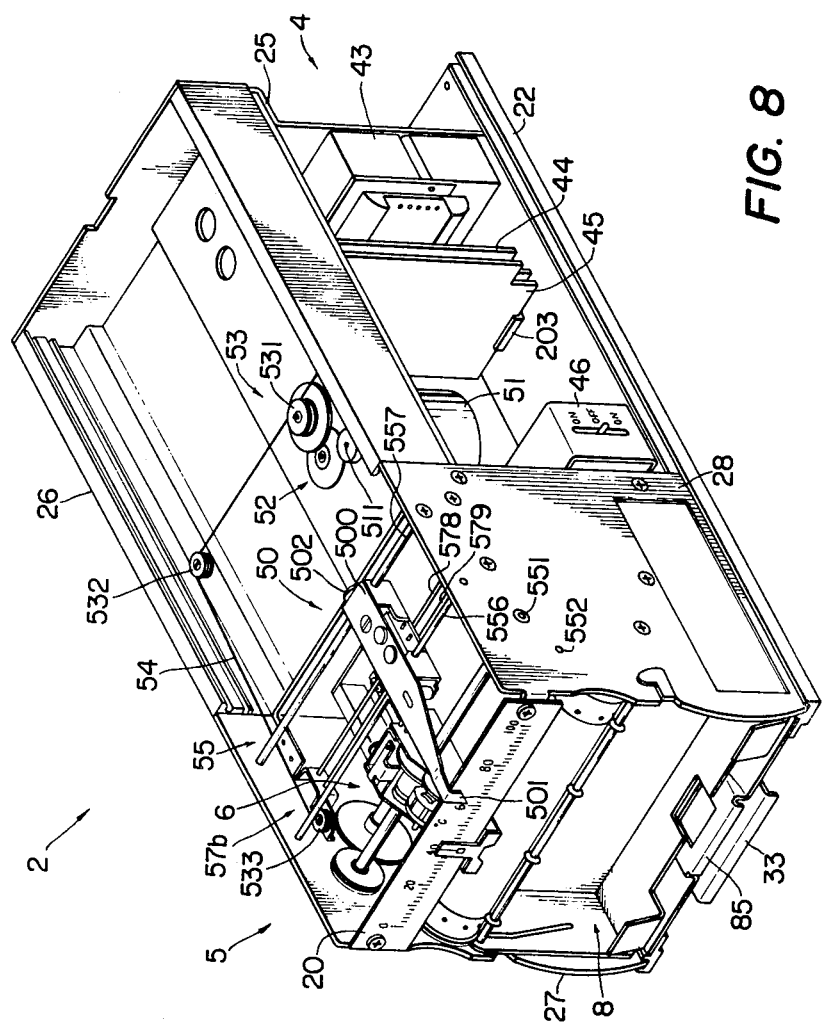
FIG. 8 is a frontal perspective view of an internal frame on which internal components are mounted.
Figure 9:
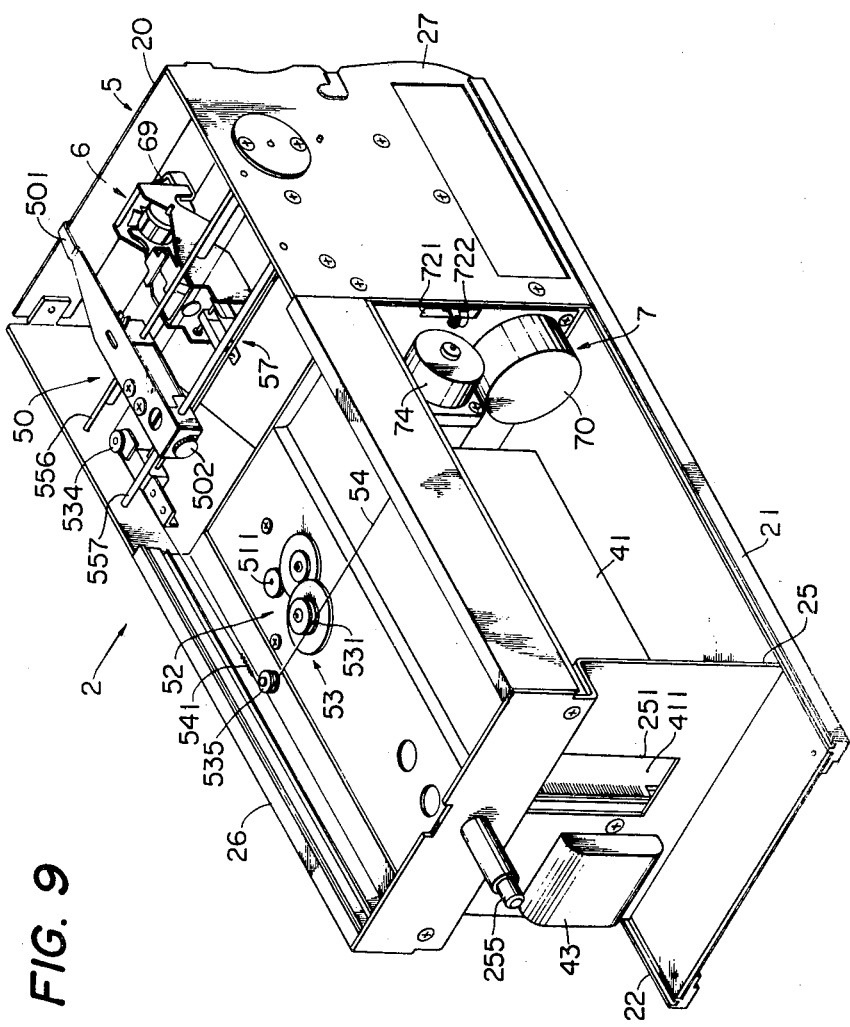
FIG. 9 is a rear perspective view of the internal frame shown in FIG. 8.

Instrument components mounted on the internal frame 2 are schematically illustrated in FIG. 8 (a frontal view) and FIG. 9 (a rear view). Major components located in the rear part of the internal frame 2 are shown in FIG. 10 (an exploded view). The reference 41 denotes a mother board which is a major component of the electrical circuit means located in the center and along the length of the internal frame 2.

The mother board 41 has its upper edge fitted into the groove 262 of the upper plate 26 and its lower edge fitted into two pairs of pressed-out portions 232 and is fastened with screws to the L-shaped members 253 and 254 equipped to the rear plate 25. The mother board comprises a connection means 411 which is exposed through the opening 251 of the rear plate 25 so that the connector 193 can be connected to the connection part 411 from the back of the rear plate 25. The mother board 41 has a plug part comprising a plurality of connection pins.

A power transformer 43 affixed to the rear plate 25 in the opening 252 is provided. An amplifier card 44, a range card 45, and a chart feed selection switch 46 are also provided. The cards 44 and 45 are set in a synthetic resin holder 203 of U-shaped cross-section which is thermally bonded to the upper plate 26 and the base plate 23 as shown in FIG. 8. The cards 44 and 45, the transformer 43 and the switch 46 are accommodated in the space on the right of the mother board 41 in the internal frame 2 (FIG. 8).

In the embodiment disclosed in FIG. 8, multipoint recorder for 6 measuring points is employed. When a two-pen recorder is employed, the space on the left of the mother board can be used to accommodate its components. According to the invention, a printed circuit board, called the mother board, is installed in approximately the center of theh internal frame 2, and instrument components are positioned around the mother board. Flexible wires and connectors are employed for electrical connections between instrument components to eliminate error in electrical connections and simplify making connections or disconnections.

An indicating recording mechanism 5 is installed in the front part of the internal frame 2, comprising a self-balancing motor 51, a gear mechanism 52 connected to an output shaft 511 of the motor 51, a pulley mechanism 53, and a string 54, as shown in FIG. 8. The string 54 is wound several turns on a drive pulley 531 of the pulley mechanism 53 and threaded on idle pulleys 532 to 535 by way of a dotting mechanism (or pen mechanism). The two ends of the string are secured to both ends of a thin, finely coiled spring 541 as shown in FIG. 9. Thus the string 54 is kept constantly taut, permitting the dotting mechanism to be driven without any slack or play. Being readily expandable because of the spring 541, the string 54 can be easily disengaged from the pulleys for servicing.

The motor 51 is secured to the bottom of the upper plate 26 by passing through the holes 265. A group of shafts 55 are installed between the side plates 27 and 28, comprising a drive shaft 551 and a holding shaft 552. A groove 553 is formed along the full length of the drive shaft 551.

A dotting mechanism 6 supported by the drive shaft 551 and the holding shaft 552 is provided, as shown in FIG. 8. The components of the dotting mechanism 6, schematically shown in FIGS. 11 to 14, which comprise a dotting frame 61, a rocking frame 62, a cam lever 63 which is idly engaged with a shaft 621 of the rocking frame 62, and a drive drum 64 which is held between bearings 611 and 612 provided on both sides of the dotting frame 61 and is rotatably coaxially with these bearings.

The drive drum 64 is equipped with a pin 641 extended inwardly in the radial direction. The pin 641 engages the groove 553 of the drive shaft 551 which is coupled to the drive drum 64. The drive drum 64 slides on the drive shaft 551 in the axial direction, thus conveying a rotating force thereto.

Figure 15:
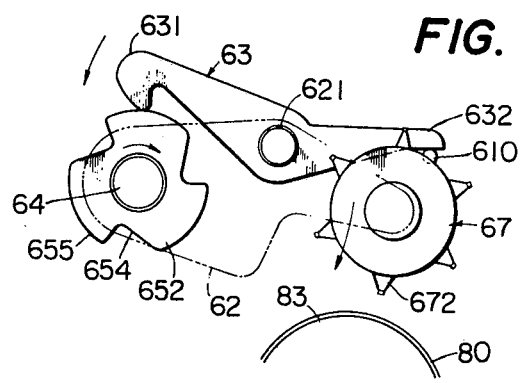
FIGS. 15 and 16 are schematic views showing operations of the dotting mechanism.

A cam 65, fastened to the drive drum 64, comprises a center disk portion 651, a cam portion 652 on the right, and a geneva portion 653 on the left. The cam portion 652 has three recesses 654 an angle of 120° away of each other, and circumferential portions 655 continuing to the recesses 654 respectively (FIG. 15).

The geneva portion 653 has three geneva pins 656 at regular intervals. A geneva mechanism 66, rotatably mounted on the shaft 621, comprises a geneva 661 having 6 recesses and inversely arcuate portions, a disk 662 and a gear 663.

The dotting mechanism 6 further comprises a dotting body 67 and a gear 671 which engages with the gear 663. The dotting body 67 and the gear 671 together are coupled to a rocking shaft 622 of the rocking frame 62. Six dotting needles are radially installed on the dotting body 67 and numbered 1 to 6.

An ink pad mechanism 68 comprises a mounting arm 681 and a pad wheel 683 coupled to a shaft 682 of the mounting arm 681. The pad wheel has pad cells radially which contain individual ink pads soaked with inks of different colors. The mounting arm 681 has two circular holes 684 and 685, and a slit through the centers of the two holes, permitting the open end of the mounting arm 681 to be resiliently opened or closed. The outer hole 684 is resiliently coupled to the shaft 611. Thus the ink pad mechanism 68 is dismountably coupled to the shaft 611.

When the ink pad mechanism 68 is mounted in position, a pin 686 on the other end of the pad wheel 683 engages a hole 664 on the disk 662, and a pin 687 comes in contact with the upper surface of the rocking frame 62. As a result, the pad wheel 683 is axially aligned with and rotatably coupled to the geneva mechanism 66.

Figure 11:
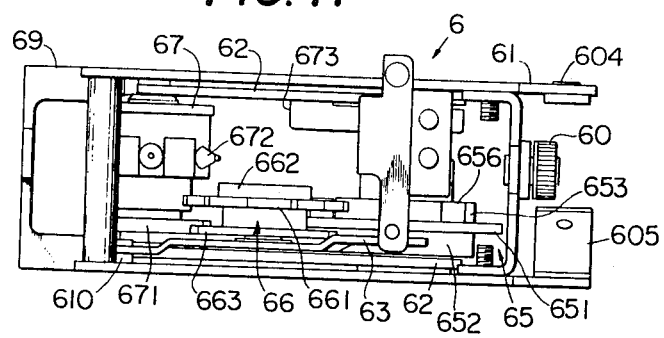
FIG. 11 is a top view of a dotting mechanism used in the invention.
Figure 14:
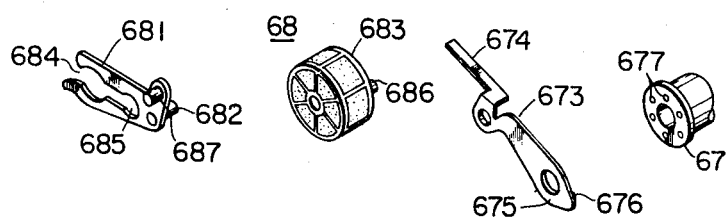
FIG. 14 is an exploded view of an ink pad used in the disclosed embodiment.

A spring plate 673 shown in FIGS. 11 and 14 is secured to a pillar 623 of the rocking frame 62. One end of the spring plate 673 comes in contact with an end of the mounting arm 681 and provides the mounting arm 681 with a rotating force (clockwise in FIG. 14) about the hole 684. The spring plate 673 has at the other end a projected portion 676, which engages one of recessed portions 677 formed on a side of the dotting body 67, causing the dotting body 67 to move in discrete equal intervals as projected portion 676 engages subsequent equidistant recessed portions 677. The cam 65, the geneva mechanism 66, the dotting body 67 and the ink pad wheel 683 are of molded synthetic resin which is resistant to abrasion. The dotting frame 61 is equipped with a rest pin 610.

When the drive drum 64 is rotated by the shaft 551, the geneva pin 656 engages one of the grooves causing the geneva 661 to be rotated through an angle of 60°. As a result, the dotting body 67 is rotated through 60° by the gears 663 and 671, and one of the six dotting needles 672 corresponding to one measuring point is brought opposite to the recording chart. The cam lever 63 has its tail portion 632 rested on the rest pin 610 of the dotting frame 61 and its hooked portion 631 in contact with the cam portion 652. When the drive drum 64 is rotated, the cam lever 63 raises its hooked portion 631 on its tail portion 632. Since the cam lever 63 is rotatably coupled to the rocking frame 62 through the shaft 621, the free end of the rocking frame 62 swings down about the bearings 611 and 612 by its weight or a spring (not shown by diagram).

Figure 16:
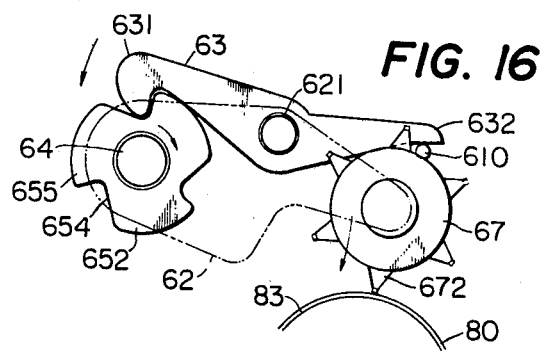

FIG. 15 shows the relation between the cam lever 63 and the cam portion 652 after the geneva pin 656 has come out of a geneva groove and a dotting needle 672 has been rotated 60° due to the 60° rotation of the dotting body 67. FIG. 16 shows the position of the cam lever 63 when its hooked portion 631 engages the recess 654 and thus the rocking frame 62 and the dotting body 67 drop together causing the needle to come into contact with the recording chart. When the next geneva pin 656 enters the next groove, the dotting body 67 rotates through 60°, causing the next dotting needle to face the recording chart. Then, again, the rocking frame 62 drops. In this manner, the dotting needles 672 are rotated as the dotting body 67 rotates intermittently, and dotting (recording) occurs when the rocking frame 62 drops thereby causing the needle to come into contact with the recording chart.

Each of the six dotting needles will record a value from its respective measuring point during the course of two complete rotations of the drum cylinder 64 or the drum shaft 551. Thus the dotting needles 672 are brought into contact with the recording chart to dot measured values on the chart corresponding to six measuring points in six colors.

When the ink becomes thin on the chart, the ink pad wheel 683 together with the mounting arm 681 is removed and the ink pads are each replenished with the proper color ink. This simplifies supplying ink and eliminates color mixing among the inks.

Figure 12:
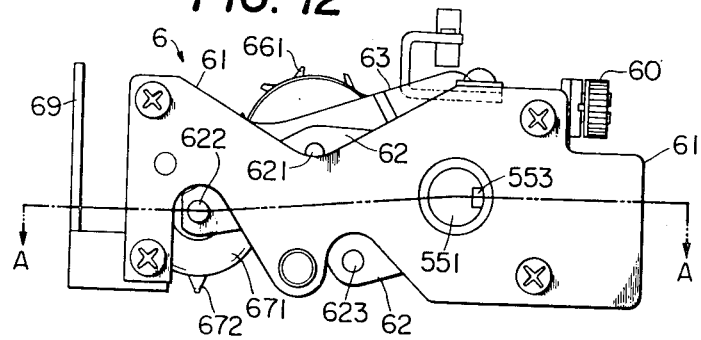
FIG. 12 is a side view of the apparatus shown in FIG. 11.
Figure 13:
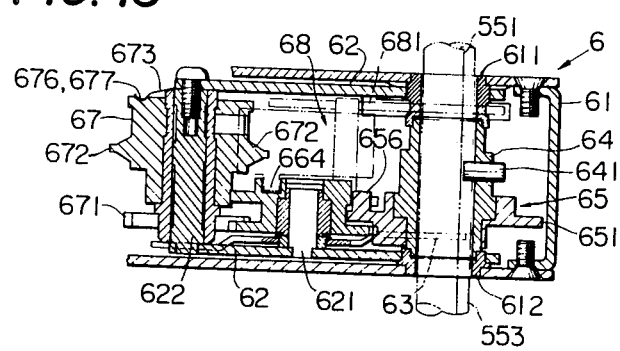
FIG. 13 is a partial cross-sectional view taken along line A—A of FIG. 12.
Figure 17:
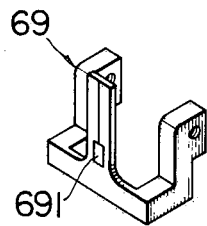
FIG. 17 is a perspective view of a pointer used in the disclosed embodiment.

A screw 60 for fixing the string 54, and a pointer 69 installed at an end of the dotting frame 61 are as shown in FIG. 12. The pointer 69 (FIG. 17) is of transparent acrylic resin, having a red index 691 in the front. The pointer 69 installed across the side plates 27 and 28 faces the scale 20 and indicates the measured value at the index 691. The red index 691 on the transparent pointer 69 in combination with the white scale 20 graduated with black divisions facilitates reading.

Figure 18:
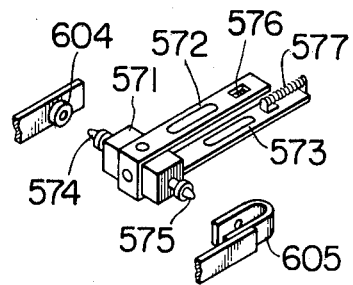
FIG. 18 is a perspective view of the moving part of a slide resistor used in the disclosed embodiment.
Figure 19:
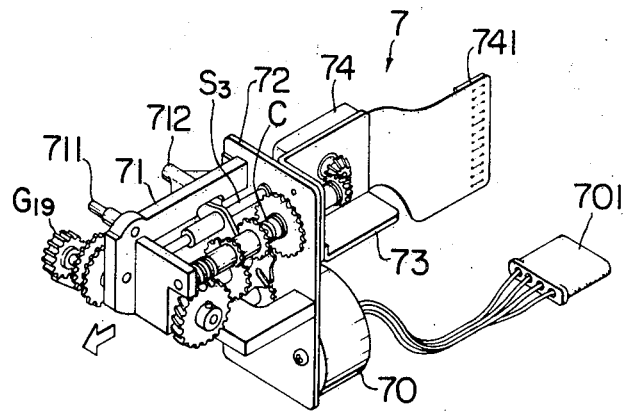
FIG. 19 is a perspective view of a torque transmission mechanism used in the disclosed embodiment.
Figure 20:
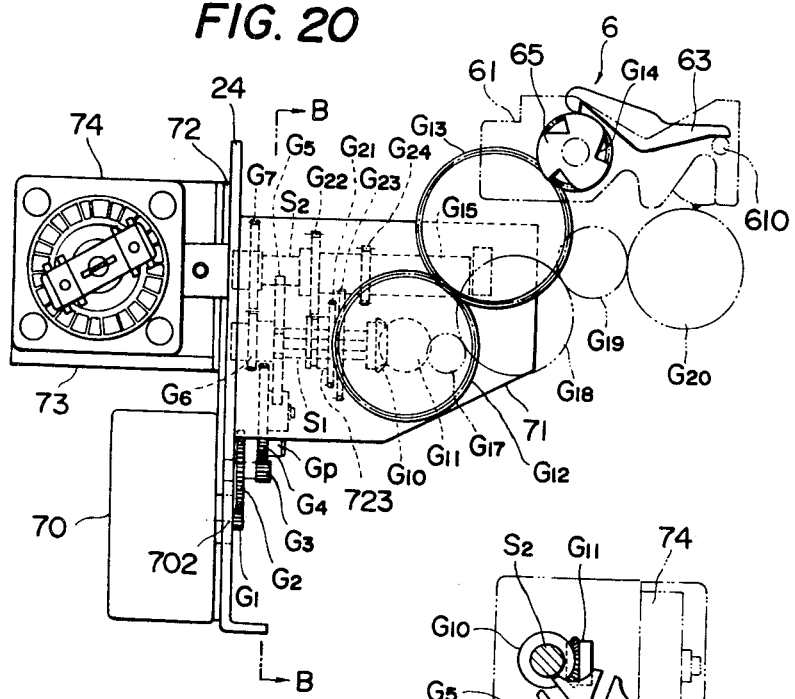
FIG. 20 is a side elevation view of the apparatus shown in FIG. 19.
Figure 21:
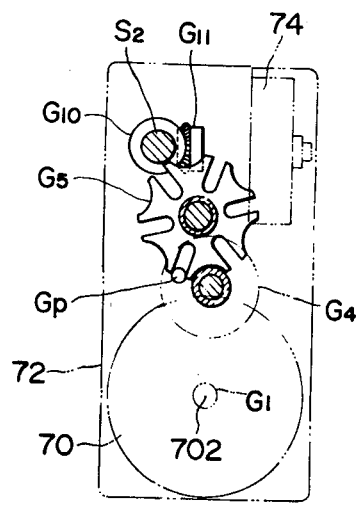
FIG. 21 is a cross-sectional view taken above line B—B of FIG. 20.
Figure 22:
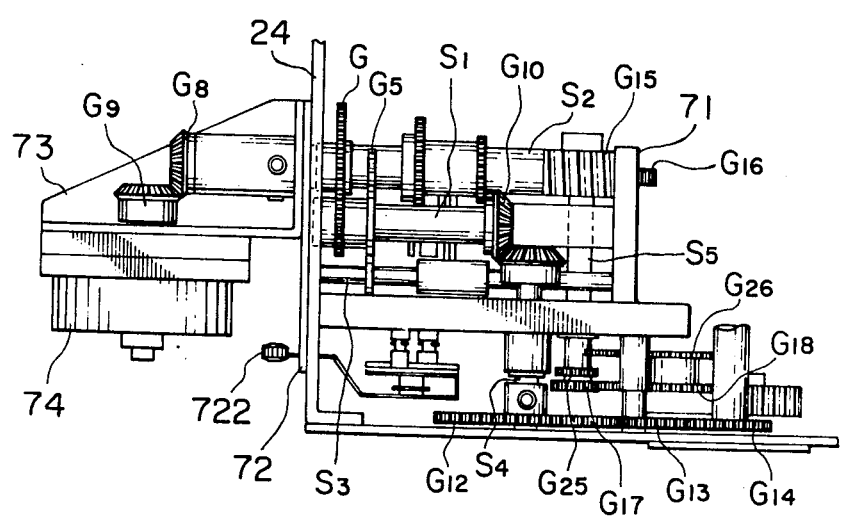
FIG. 22 is a plan view of the apparatus shown in FIG. 20.

Referring to FIG. 18, a perspective view of a moving part 57a of the slide resistor 57 which comprises a fixed part 57b in addition to the moving part 57a integral with the dotting mechanism 6 is shown. The moving part 57a comprises a square mounting member 571, and upper and lower moving contactors 572 and 573. The mounting member 571 is made of an insulating material, having needle shafts 574 and 575 on both sides.

The shafts 574 and 575 are fitted between a fixed bearing 604 and a U-shaped spring bearing 605 which are provided in the rear of the dotting frame 61, thereby permitting the mounting member 571 to be rotatably supported therebetween. The moving contactors 572 and 573 are of an electrically conducting plate made of phosphor bronze or the like, which is bent into a U-shaped with the upper half being shorter than the lower half. The bent portion of the contactor is fastened to the mounting member 571.

Contacts 576 and 577 are affixed to the contactors 572 and 573 at end portions opposite to each other. The contacts 576 and 577 are of coiled metal wire made of a corrosion-resistant and wear-resistant material. The ends of the contacts 576 and 577 are secured to studs formed by raising part of the moving contactors, enabling intermediate portions of the coils to be readily displaced in the diametrical direction.

The fixed portion 57b comprises a resistance wire 578 and a lead wire 579 installed in parallel to each other across the side plates 27 and 28 as shown in FIG. 8. The resistance wire 578 comprises a core metal wire on which an insulating wire is finely wound and then a resistance wire is wound. The lead wire 579 comprises a metal rod of triangular cross-section, one of the edges being slightly rounded and coated with a precious metal. The lead wire 579 has its precious metal edge in contact with the contact 576 of the moving contactor.

A reference power source is connected to the resistance wire 578. A voltage drop across the resistance wire 578 corresponds to the distance on the resistance wire 578 from its left end to the point where the contact 577 is in contact with the resistance wire 578. This voltage drop serves as a position feedback voltage. A measuring voltage, corresponding to the measured value from the terminal plate 134 on the rear plate 13, is led through the lead wire 579 contact 576, moving contactors 572 and 573, and contact 577 and compared with the position feedback voltage on the resistance wire 578.

The resultant voltage difference is amplified and supplied to the control coil of the balancing motor 51, causing its output shaft 511 to be rotated forward or reversely according to the polarity of the voltage applied. The rotating force of the motor 51 drives the gear mechanism 52 and the string 54 causing the dotting mechanism 6 to be moved laterally along the drive shaft 551 and the holding shaft 552, thereby compensating for the deviation and establishing a self-balance point. Thus the dotting mechanism 6 is stationary on the shafts 551 and 552. The measured value can be read both from the value indicated by the pointer 69 on the scale 20 where the dotting mechanism 6 is at a self-balance point and from the dot recorded on the chart.

In this example, the feedback slide resistor 57 is directly coupled to the dotting mechanism 6 and hence measuring error due to slipping of the string is eliminated. Furthermore, contact resistance is reduced because the coil contacts are brought into contact with the lead wire 579, as well as the resistance wire 578.

An alarm mechanism 50 for high limit (FIGS. 8 and 9) is supported slidably by shafts 556 and 557 between the side plates 27 and 28. The alarm mechanism 50 comprises a main body 500 and an indicator part 501. The main body 500 comprises a rocking element which engages an engaging shaft of the dotting mechanism, and a micro-switch which is turned on-off by the rocking element. An alarm point can be set by loosening a fixed knob 502 and sliding the indicator 501 adjacent to the desired measurement value indicated on the scale 20. An alarm mechanism for low limit compriese the same components as the alarm mechanism for high limit.

A torque transmission mechanism 7 is schematically illustrated in FIGS. 19 to 22, comprising a synchronous motor 70, a main frame 71, a mounting plate 72, an L-shaped plate 73, and a measuring point selection switch 74 equipped to the L-shaped plate 73. First to fifth supporting shafts $S_1$ to $S_5$ held between the main frame 71 and the mounting plate 72 are provided. Also provided are gears $G_1$ to $G_{26}$ on the shafts $S_1$ to $S_5$ and on a pin shaft with one end fixed. The fourth and fifth supporting shafts $S_4$ and $S_5$ are positioned at right angles to the first to third supporting shafts $S_1$ and $S_3$. The second supporting shaft $S_2$ is divided into two portions which are of the same diameter. A helical spring clutch C is wound on the divided portion. The third supporting shaft $S_3$ has a slide drum 723 which is moved in the axial direction by a selection lever 722 adjacent to and accessible through a window 721 of the mounting plate 72.

The gear $G_5$ is a geneva gear which engages a pin $G_p$ on the gear $G_4$. The gears $G_1$ to $G_9$ convert the rotation of the synchronous motor 70 into an intermittent rotation and transmit the intermittent rotation to the selection switch 74. A train of gears $G_{10}$ to $G_{14}$ transmit the intermittent rotation of the geneva gear $G_5$ to the dotting mechanism 6. A train of gears $G_{15}$ to $G_{20}$ transmit the torque of gear $G_7$ to a sprocket to drive the recording chart.

When the selection lever 722 is set in the center of the window 721, the spring clutch C on the second shaft $S_2$ is wound up causing the shaft $S_2$ to transmit the torque of the gear $G_7$. When the selection lever 722 is locked in its lower position, the gear $G_{21}$ fastened to the slide drum 723 on the first supporting shaft $S_1$ becomes engaged with the gear $G_{22}$ on the second supporting shaft $S_2$. When the selection lever 722 is locked at its upper position, the slide drum 723 slides on the shaft $S_1$ causing the gear $G_{23}$ to engage with the gear $G_{24}$. As a result, the spring clutch C is unwound, the second supporting shaft $S_2$ is divided in two, and the torque is transmitted from the first supporting shaft $S_1$ by way of gears $G_{21}$ to $G_{22}$ of gears $G_{23}$ to $G_{24}$. Thus, by selecting the position of the lever 722, the chart speed can be changed in three steps.

In this embodiment, the chart speeds are 20 mm, 40 mm and 80 mm per hour when the synchronous motor 70 is driven at a speed of 250 rpm. The gears $G_{18}$ and $G_{26}$ can laterally engage the gears $G_{17}$ and $G_{25}$. By the switching of these gears, chart speed variations due to difference in power supply frequency between 50 Hz and 60 Hz are controlled enabling a constant rate of speed of the chart feed to be maintained.

The torque transmission mechanism 7 is affixed to the internal frame 2 in such manner that the main frame 71 is inserted therein through the opening 241 of the intermediate plate 24 and fastened to the side plate 27 by screws against studs 711 to 713 (stud 713 not shown) from outside the side plate 27. Jacks 701 and 741 are connected to the plug part 412 of the mother board 41 to provide electrical connections with other components. Being dismountably housed in the internal frame 2, the torque transmission mechanism 7 can readily be checked or adjusted when necessary. A gear box coupled directly to the rotating shaft 702 of the motor 70 is provided. Using this gear box, the motor speed can be changed in the ratio 1:60 by switching the direction of rotation. Thus the chart speed can be changed in six steps through the gear box.

Figure 23:
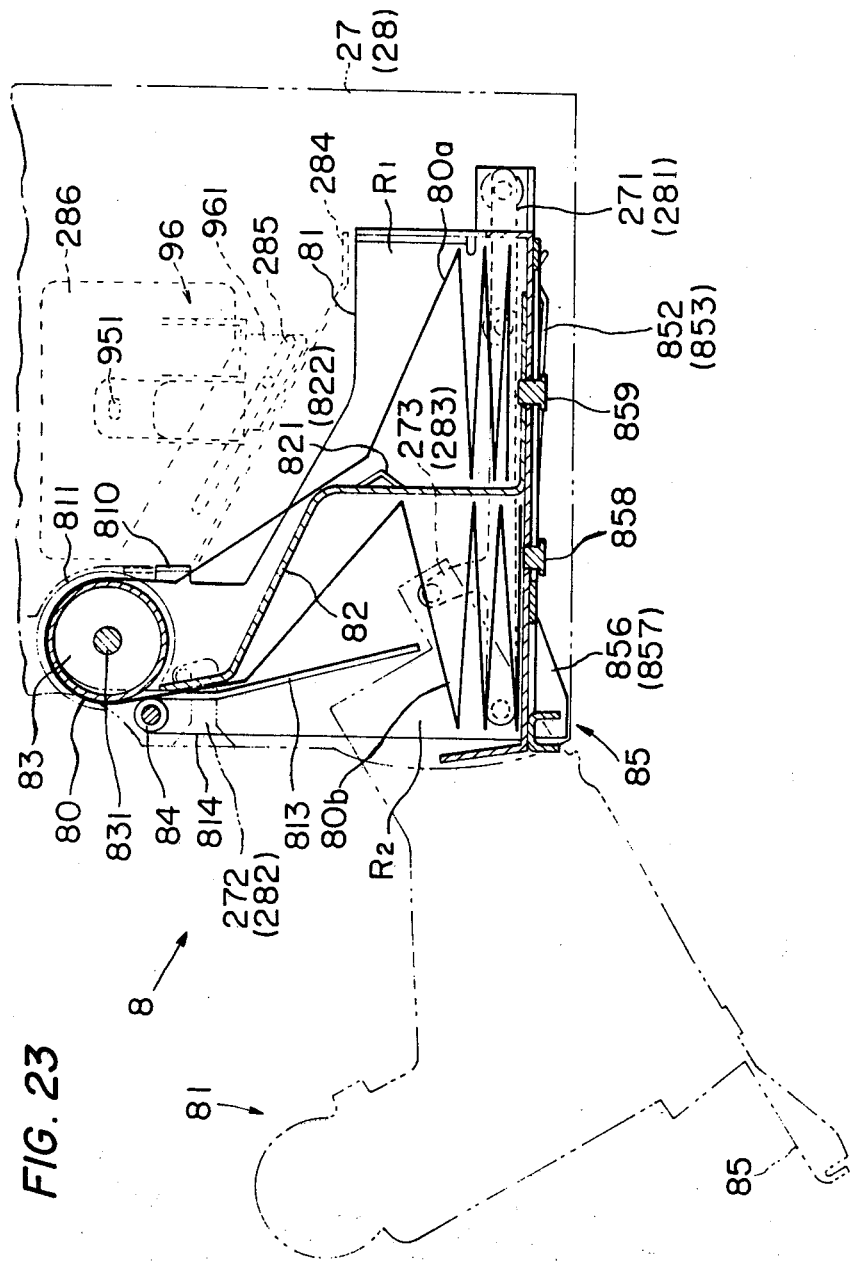
FIG. 23 is a cross-sectional view of a chart feed mechanism of the recorder.

Referring to FIGS. 23 and 24, the chart feed mechanism 8 is schematically illustrated. The chart feed mechanism 8 comprises a recording chart 80, a box 81, a partition 82, a sprocket 83, and a pressure roller 84. The sprocket 83 is frictionally coupled to the last gear $G_{20}$ of the torque transmission mechanism 7 by using an annular spring plate as frictional coupling means. The pressure roller 84 is equipped with four idle rollers 841 to 844.

The box 81 is divided by the partition 82 into front and rear compartments; the rear spacer $R_1$ is to accommodate a blank chart 80a, and the front space $R_2$ is for a recorded chart 80b. The box 81 has circular portions 811 opposite to each other, and a rotating shaft 831 of the sprocket 83 is pivotally supported by holes 812 on the circular portions 811. An elastic part 814 is formed near the arcuate portion 811 by a cut 813.

The pressure roller 84 has one shaft end fitted into a hole 815 on the right, and the other shaft end fitted into a hole 815 on the left as the elastic part 814 is pressed outward. Thus the pressure roller 84 can readily be set into position or dismounted when necessary. The pressure roller 84 is parallel to the sprocket 83, having its idle rollers 841 to 844 brought into contact with the sprocket surface.

Three pairs of pins 816 to 818 are provided on two opposing sides of the box 81. Two pairs of pins 817 and 818 in the lower part engage the slots 271 and 281 of the side plates 27 and 28 respectively. The upper pins 816 engage L-shaped portions 272 and 282 sheared out of the side plates 27 and 28. A pinch plate 85 has a hole 851, engaging legs 852 and 853 with ends bent like "V", a mounting leg 854 with a slot 855, and triangular pressure pieces 856 and 857 (FIG. 25). The pinch plate 85 has its pins 858 and 859 engaging the slide slot 855 and is thereby mounted on the bottom of the box 81. The mounting leg 854 is bent downward to exert an upward force on the engaging legs 852 and 853 when the pinch plate 85 is mounted on the flat bottom of the box 81.

The chart feed mechanism 8 comprising the foregoing box 81 and the partition 82 is located between the two side plates 27 and 28 in the internal frame 2. FIG. 23 schematically illustrates how the chart feed mechanism 8 is mounted in position. In FIG. 23, the pinch plate 85 is set into the bottom of the box 81, causing the V-shaped ends of legs 852 and 853 to engage the slot 819 in the rear part of the bottom of the box 81, and the pressure pieces 856 and 857 to raise the chart feed mechanism 8. The chart feed mechanism 8 is raised until the upper pair of pins 816 engage the L-shaped portions 272 and 282.

In this position, the recording surface on the sprocket 83 is located opposite to and a given distance away from the dotting needles 672 on the dotting body 67. When the recording element is a pen, the pen is brought into contact with the chart 80 by the chart feed mechanism 8. In FIG. 23, the reference 284 denotes a partition installed between the side plates 27 and 28.

When the rotating force from the torque transmission mechanism 7 is supplied to the sprocket 83 by the gear $G_{20}$, a blank chart 80a folded in the room $R_1$ is fed upward to the sprocket 83 where the measured value is dotted on the chart by the dotting mechanism 6. The recorded chart 80b is transported along the sprocket 83 and between the pressure roller and the sprocket and then folded in the store room $R_2$. The blank chart 80a, when removed from the room $R_1$, is stroked by two projections 821 and 822 provided on both sides of the partition 82, to prevent duplicate chart feed. A pair of shrouding pieces 810 formed by bending part of the box 81 are useful for directing the blank chart 80a on to the sprocket 83 when it approaches the sprocket 83. These arrangements assure steady chart feed and folding.

The recorded chart 80b can be removed from the store room $R_2$ when the door 15 is opened. The chart 80 may be withdrawn while recording or replaced with a new one in the following manner as shown in FIGS. 23, 24 and 25. The pinch plate 85 is pulled to cause its pins 858 and 859 to slide along the slot 855 until the pin 859 touches the rear end of the slot 855 where the pinch plate 85 stops. Concurrently, the V-shaped vent portions of the engaging legs 852 and 853 engage the slot 819. By pulling the pinch plate 85, pressure pieces 856 and 857 are removed from the bottom of the chart feed mechanism 8, causing a pair of pins 816 to drop from the L-shaped portions 272 and 282 onto the flat portion. As a result, the front of the chart feed mechanism 8 drops and the chart feed mechanism 8 tilts slightly.

By this procedure, the sprocket 83 is separated from the recording element (dotting mechanism or recording pen), and the chart feed mechanism 8 is able to be withdrawn. The pinch plate 85 is pulled by fingers applied to the opening 851. This causes two pairs of pins 817 and 818 to slide along the slots 271 and 281 whereby the whole body of the chart feed mechanism 8 comes out until the pins 817 touches the front ends of the slots 271 and 281. Then, due to the weight of the chart feed mechanism 8, the chart feed mechanism 8 rotates on the pins 817, and the rear pins 818 enters the arcuate slots 273 and 283, causing the chart feed mechanism 8 to be tilted as indicated by the two-dot chain line in FIG. 23. Thus the recorded chart 80b, together with blank chart 80a, can be withdrawn with ease.

Loading of a blank chart 80a is done in the following manner. The pressure roller 84 is dismounted from the box 81, and a blank chart 80a is placed on the room $R_1$. The leading part of the chart is threaded on the sprocket 83 with its gear engaging with feed perforation 801 on the way and carried over to the room $R_2$. At the point of entrance to the sprocket 83, the chart 80a is held by the shrouding pieces 810 on both sides. Then the pressure roller 84 is mounted in position. When the blank chart 80a has been set, the chart feed mechanism 8 is returned into the internal frame 2, which is then slid into the outer case 1. With the door 15 closed, the instrument is ready for recording operation.

Figure 26:
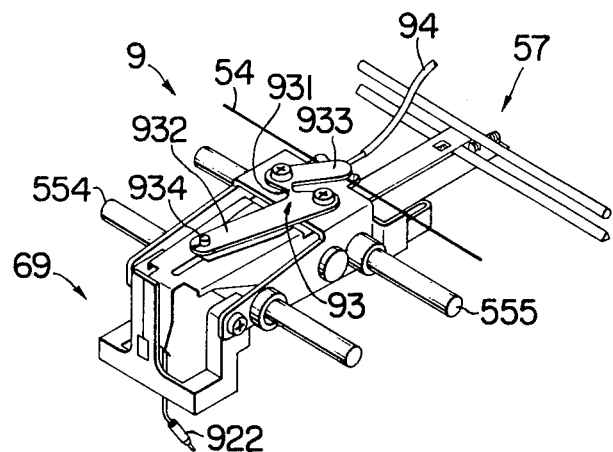
FIG. 26 is a perspective view of the construction of a first pen used for the recorder.

Referring to FIG. 26, a pen mechanism used for the recorder of the invention is schematically shown. This pen mechanism 9 is for a single measuring point, comprising a pen frame 91, a recording pen 92 and a fixing plate 93. The pen frame 91 and the recording pen 92 are shown in detail in FIG. 27. Holes 913 to 915 are provided on a side portion 911 of the pen frame 91, as are holes 913 to 915 on a side portion 912 thereof, the former holes located opposite to the latter holes.

Bearings are fitted in the holes 913 and 915. A supporting shaft 555 is relatively tightly coupled to the bearings of the holes 915 so that the shaft 555 can rotate and also slide. A supporting shaft 554 is loosely coupled to the bearings of the holes 913 and supports the weight of the front part of the pen mechanism 9. Short mounting shafts 916 are securely fitted in the holes 914. The shafts 916 have their circular cylindrical ends and tapered portions exposed inside the pen frame 91. The pen frame 91 has a pan portion 917 with two rectangular corners bent up.

The recording pen 92 comprises a stainless steel pipe 921, a pen point 922 of double-tube construction which is dismountably fitted to the pipe 921, a holder 923 made of a thin metal plate, and a V-shaped spring plate 924 with with one end fastened to the holder 923. Openings 925 of the same shapes are formed on both sides of the holder 923, permitting the recording pen 92 to be dismountably affixed to the mounting shaft 916. The two sides of the holder 923 are diverged toward the rear, the distance across the two sides being slightly larger than the distance across the tapered portions of the mounting shafts 916. Thus the recording pen 92 is mounted across the shafts 916 without causing any slack or play or rocking in the lateral direction.

The fixing plate 93 is a cutout from a relatively thick plate, having plate portions 932 and 933 and a link portion 931 linking the two portions 932 and 933. The longer plate 932 has one end bent upward. The fixing plate 93 is fastened to the top surface of the pen frame 91 with screws through holes on the plate portions 932 and 933. The end of the longer plate portion 932 faces the end of the spring plate 924, and the end of the shorter one faces the pan portion 917.

The string 54 is securely held between the plate portion 933 and the pan portion 917 by pressure. The bent-up corners of the pan portion 917 prevent the string from becoming loose. An adjusting screw 934 is provided at the end of the plate portion 932, and the end of the screw 934 engages a slot formed at the end of the spring plate 924.

When the screw 934 is rotated counterclockwise, the spring plate 924 moves away from the fixing plate 93 whereby the pen pressure increases. According to the invention, the pen pressure can be adjusted by spring pressure, not simply by the weight of the pen, with the result that pen recording on the chart is clear and legible at all times.

In FIG. 26, a thin ink tube 94 of synthetic resin for supplying ink to the pen 92 is shown. The construction of an ink tank 95 is schematically shown in FIG. 28, and the ink tank 95 mounted in position is indicated by the broken line in FIG. 23. Ink is supplied to the ink tank 95 by way of a valve 952 provided at an ink supply port 951. The valve 952 serves to isolate the ink from the outer air, thus preventing the ink from becoming solidified.

The ink tank 95 is mounted on the instrument by a mount 96 (FIG. 29). The mount 96 has a leg 961 whose lower edge is cut aslant. This slanting edge 962 is in contact with one surface of the partition 284. The mount 96 is fastened to the side plate 28 by a screw inserted in a slot 285 slanted the same as the slant of the partition 284. The ink pressure, i.e., the head (the difference between the ink level in the ink tank and the height of the pen point), can be adjusted by moving the ink tank 95 along the slanting slot 285. The ink will not spill from the ink tank 95 while it is moved, because the ink tank 95 moves with the mount 96 of which the slanting edge 962 is in contact with the slanting surface of the partition 284, thus permitting the ink tank 95 to be kept level.

The ink tank 95 can be replaced with a new one or the ink can be replenished through a triangular window 286 provided on the side plate 28. The amount of ink stored in the tank 95 can be observed through the triangular window 286. The ink tank 95 comprises a pipe 953 (FIG. 28) for passing ink, and a spacer 963 (FIG. 29) for filling space in the mount 96 when one ink tank 95 is mounted.

Figure 27:
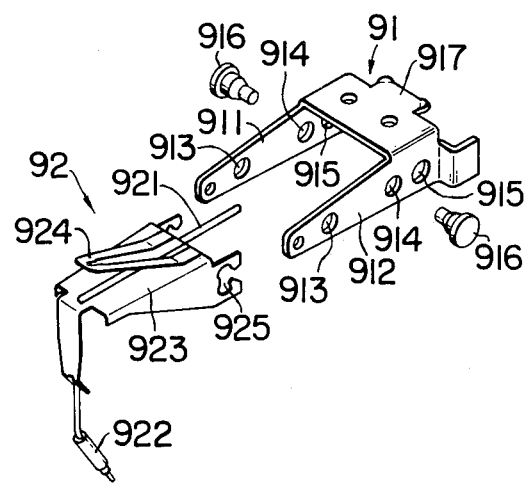
FIG. 27 is a perspective exploded view of a pen frame and a recording pen used in the construction as in FIG. 26.

FIG. 30 is a perspective view of a pen mechanism 9' used with the pen mechanism 9 shown in FIGS. 26 and 27. The pen mechanism 9' comprises a pair of supporting shafts 554' and 555' which are constructed in the same manner as the supporting shafts 554 and 555 of the pen mechanism 9. The supporting shafts 554' and 555' are located between the side plates 27 and 28 below the shafts 554 and 555. The pen mechanism 9' is supported on the shafts 554' and 555' and does not cross the other pen mechanism 9.

The pen mechanisms 9 and 9' are roughly of the same construction. The height of the pen mechanism 9' is lower than that of the other. Also, the pen mechanism 9' has an indicator part 927' instead of the transparent pointer 69 of acrylic resin of the pen mechanism 9. Located in the front of the pen 92', the indicator part 927' is coated with a fluorescent paint of suitable color such as green, with an index line 928' in the center. The pen mechanism 9' is mounted in position in the same manner as described for the pen mechanism 9.

In this self-balancing recorder, the pen mechanism 9 serves as the first pen mechanism, and the pen mechanism 9' as the second pen mechanism. In practice, for example, the first pen mechanism 9 is used to record with a red ink on the chart 80 a temperature taken in a furnace, and the second pen mechanism 9' is used to record with a blue ink on the same chart 80 the flow of fuel supplied to the furnace. The balancing motor, the gear mechanism, the amplifier card, the range card, etc. for the second pen mechanism are normally located in the left half of the space in the internal frame 2. Two ink tanks are installed on the mount 96 with the spacer 963 removed. The indicator part 927' and the resistor 57 of the second pen mechanism 9' are constructed in the same manner as in the first pen mechanism 9.

Figure 31:
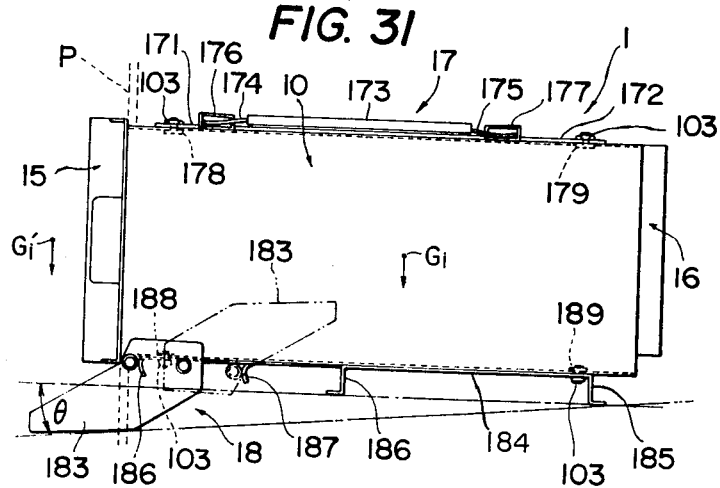
FIG. 31 is a side view of the recorder with handcarrying mechanism and a leg mechanism.

In FIG. 1, the reference 17 denotes a handle mechanism and the reference 18 denotes a leg mechanism. The handle mechanism 17 comprises two fixed portions 171 and 172, and a handle portion 173 as shown in FIG. 31. T-shaped link plates 174 and 175 are elastically affixed to both ends of the handle 173, and the side portions of the link plates 174 and 175 are retained by square frames 176 and 177 of the fixed portions 171 and 172. The fixed portions 171 and 172 have holes 178 and 179 corresponding to the mounting holes 111 and 112 on the main body 10.

Figure 32:
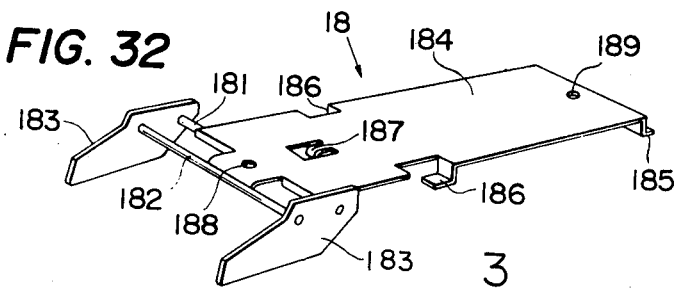
FIG. 32 is a perspective view of the leg mechanism.

The leg mechanism 18, as shown in FIG. 32, comprises a pair of movable legs 183 of approximately trapezoidal shape, which are connected together by a mounting shaft 181 and a connecting shaft 182. The leg mechanism 18 further comprises a mounting plate 184 made of a metal plate having a rear leg 185, a pair of front legs 186, an arcuate engaging piece 187, and holes 188 and 189. The movable legs 183 are rotatable on the shaft 181. The handle mechanism 17 and the leg mechanism 18 are fastened to the outer case 1 by screws 103 through holes 111 and 112 and their corresponding holes 121 and 122, and holes 178 and 179 and their corresponding holes 188 and 189.

In the normal operating state, the recorder is placed level on a table or the like by locking the movable legs 183 in position as indicated by the two-dot chain line in FIG. 31 and thus bringing the front and rear legs 186 and 185 in contact with the top of the table. The movable legs 183 are retained between the arcuate part of the engaging piece 187 and the base plate 12 of the outer case 1. Gripping the handle 173, one can readily carry the recorder to a point where it is necessary. The recorder may be used at a tilt as shown in FIG. 31 by turning over the movable legs 183 as indicated by the solid line and by locking them. At a tilt, the recorder can be conveniently operated and this facilitates monitoring of values being recorded.

Figure 33:
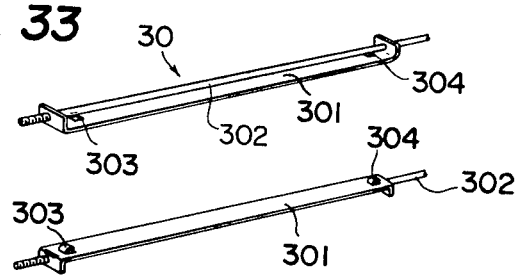
FIG. 33 is a perspective view showing a fastening member used for the outer case of the recorder.

With the handle mechanism 17 and the leg mechanism 18 removed, the instrument can be mounted on a panel like a usual panel-mounting instrument. For example, the instrument is fitted into a panel-cut on a panel P (indicated by the dotted line in FIG. 31) from the front of the panel until the flanges 141 and 142 of the front frame of the instrument come in contact with the surface of the panel. The instrument is secured in position by the use of a fastening metal 30 shown in FIG. 33. The fastening metal 30 comprises an elongated plate 301 and a screw rod 302. The plate 301 has both ends bent at right angles where a threaded hole and a plain hole are formed respectively. On the fastening plate 301 are L-shaped hooks 303 and 304 toward the rear, in positions corresponding to the mounting holes 111, 112, 121 and 122 on the outer case 1. The screw rod 302 is installed on the plate 301 as shown in FIG. 33. Then the hooks 303 and 304 are fitted into the mounting holes 111, 112, 121 and 122 on the outer case 1 and the instrument is fastened to the panel with the screw rods 302.

In FIG. 31, the reference $Gi$ denotes the center of gravity of the internal frame 2 after instrument components are mounted. This center of gravity moves to $Gi'$ towards the front of the case 1 when the internal frame 2 is pulled out of the case 1. However, pulling the internal frame 2 out of the case 1 does not cause the whole instrument body to tilt forward if the movable legs 183 are turned over and locked from under the outer case 1 in the position as if the instrument were being operated on an inclined surface.

Although several embodiments of the invention have been described herein in detail, this is for the purpose of illsutrating the principles of the invention, and should not necessarily be construed as limiting of the invention since it is apparent that those skilled in the art can make many modified arrangements of the invention without departing from the true scope thereof.

We claim:

1. A self-balancing recorder comprising:
   (a) an outer housing comprising a box-like main body and a door installed at the front of the main body;
   (b) an inner housing readily mountable into and dismountable from said main body through said door, said inner housing comprising: a base plate, an upper plate parallel to said base plate, a rear plate, an intermediate plate, and two side plates opposite to each other installed on said base plate in the front part of said inner housing; the rear edges of said side plates being in contact with said intermediate plate which, together with said rear plate, said upper plate and said base plate, form a box-like compartment in the rear part of said inner housing;
   (c) electrical circuit means comprising a printed circuit board vertically installed in approximately the center of the space formed between said upper plate and said base plate, the printed circuit board thus providing two spaces on both sides;
   (d) a torque transmission mechanism comprising a mounting plate fastened to said intermediate plate, a main frame installed on one side of said mounting plate and equipped with a group of gears, and a synchronous motor installed on the other side of said mounting plate and having its output shaft coupled to said group of gears;
   (e) a recording element associated with a scale and a pointer facing the scale, a string threaded on a pulley mechanism and driven by a servo-motor, a slide resistor, and a shaft installed across said side plates, said recording element being slidably moved by said string, together with the moving part of said slide resistor, on said shaft; and
   (f) a recording chart feed mechanism comprising a box including a first compartment for accommodating an unused recording chart, a second compartment for storing a recorded part of the recording chart, and a sprocket driven by torque from said torque transmission mechanism for feeding the recording chart from the said first compartment through the said recording element and into the said second compartment.

2. A self-balancing recorder as recited in claim 1 further comprising means for securing the inner housing to the outer housing comprising a lip on the front portion of the outer housing and a pin attached to the rear portion of the inner housing, a matching female stud receiving said pin and affixed to the outer housing to secure the inner housing snugly within the outer housing.

3. A self-balancing recorder as recited in claim 1 wherein said electrical circuit means further comprises the following components; a power transformer, an amplifier card for amplifying input signals, a range card for selecting the measurement range, a holder for maintaining said cards in place, and a chart feed selection switch; all of said components being affixed to the inner housing and disposed about said printed circuit board.

4. A self-balancing recorder as recited in claim 1 further comprising a dismountable pressure roller parallel to said sprocket wheel for continuously directing a reading chart into said storage compartment after measurements have been recorded and shrouding pieces adjacent to the sprocket wheel at a point where the recording chart approaches said sprocket wheel for directing the recording chart on to said sprocket wheel.

5. A self-balancing recorder as recited in claim 1 further comprising a plurality of trains of gears and a clutch whereby the speed of the chart feed mechanism can be varied.

6. A self-balancing recorder as recited in claim 1 further comprising an alarm to indicate when any measurement value does not fall within a predetermined range of values;
   said alarm comprising a rocking element, a shaft in the recording element, and a micro-switch, said rocking element engaging said shaft to operate said micro-switch to indicate if a measurement value is not within a predetermined range.

7. A self-balancing recorder as recited in claim 1 further comprising a plurality of pairs of legs affixed to the outer housing, certain of said legs being of variable height to enable the recorder to be operated efficiently on terrain that is not level.

8. A self-balancing recorder as recited in claim 1 further comprising means for securing the inner housing in a partially removed position relative to the outer housing, said means comprising a stopper which includes a front arcuate portion and triangular hooks pointing downward for the purpose of engaging a bent portion of said outer housing, said stopper being affixed to said inner housing.

9. A self-balancing recorder as recited in claim 8 further comprising means for removing the inner housing completely from the outer housing, said means comprising means for applying upward pressure to said arcuate portion of said stopper thereby disengaging said hooks from said outer housing and enabling the inner housing to be removed.

10. A self-balancing recorder as recited in claim 1 further comprising means for connecting said electrical circuit means to receive input signals from the conditions being measured, said connecting means comprising a conducting foil sandwiched between two films, one end of said foil detachably electrically connected to said printed circuit board within the inner housing, a second printed circuit board, and the other end of said foil being detachably electrically connected to said second printed circuit board, a terminal plate, said second board being affixed to said outer housing and in communication with said terminal plate for receiving input signals respecting the conditions being measured.

11. A self-balancing recorder as recited in claim 10 wherein said foil is sufficiently long for partially removing said inner housing from said outer housing without causing the said foil to become disconnected from said printed circuit board within said inner housing.

* * * * *